United States Patent
Cho et al.

(10) Patent No.: US 12,518,972 B2
(45) Date of Patent: Jan. 6, 2026

(54) METHOD FOR FORMING THIN FILM

(71) Applicant: JUSUNG ENGINEERING CO., LTD., Gwangju-Si (KR)

(72) Inventors: Il Hyong Cho, Gwangju-Si (KR); Young Woon Kim, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 459 days.

(21) Appl. No.: 18/013,546

(22) PCT Filed: Jul. 28, 2021

(86) PCT No.: PCT/KR2021/009836
§ 371 (c)(1),
(2) Date: Dec. 28, 2022

(87) PCT Pub. No.: WO2022/025644
PCT Pub. Date: Feb. 3, 2022

(65) Prior Publication Data
US 2023/0260794 A1 Aug. 17, 2023

(30) Foreign Application Priority Data

Jul. 30, 2020 (KR) .......... 10-2020-0095209
Jul. 20, 2021 (KR) .......... 10-2021-0095003

(51) Int. Cl.
*C23C 16/14* (2006.01)
*C23C 16/455* (2006.01)
(Continued)

(52) U.S. Cl.
CPC ........ *H01L 21/28568* (2013.01); *C23C 16/14* (2013.01); *C23C 16/45536* (2013.01); *H01J 37/32449* (2013.01); *H01J 2237/332* (2013.01)

(58) Field of Classification Search
CPC .......... C23C 16/14; C23C 16/45536
See application file for complete search history.

(56) References Cited

U.S. PATENT DOCUMENTS 6,028,360 A * 2/2000 Nakamura .......... H01L 23/5226
257/306
6,309,713 B1 * 10/2001 Mak ...................... H10D 64/664
438/653

(Continued)

FOREIGN PATENT DOCUMENTS

CN 1906327 A 1/2007
JP H03215668 A 9/1991
(Continued)

OTHER PUBLICATIONS

Lee, Chang Woo, et al., "Characteristics of plasma enhanced chemical vapor deposited tungsten nitride thin films". Applied Physics Letters, 62 (1993) 3312-3314.*
(Continued)

*Primary Examiner* — Bret P Chen
(74) *Attorney, Agent, or Firm* — Renaissance IP Law Group LLP

(57) ABSTRACT

In accordance with an exemplary embodiment, a method for forming a thin film includes supplying a reducing gas onto a substrate provided in a reaction space, applying a power to generate plasma in the reaction space, and supplying a tungsten containing gas onto the substrate, and the supplying of the tungsten containing gas is intermittently performed while the reducing gas is supplied.

17 Claims, 4 Drawing Sheets

(51) Int. Cl.
  *H01J 37/32*    (2006.01)
  *H01L 21/285*   (2006.01)

(56) References Cited

U.S. PATENT DOCUMENTS

| | | | |
|---|---|---|---|
| 6,905,543 | B1 | 6/2005 | Fair et al. |
| 8,110,489 | B2 * | 2/2012 | Ganguli ............. H10D 30/0212 |
| | | | 427/299 |
| 2004/0142557 | A1 * | 7/2004 | Levy ................... C23C 16/0272 |
| | | | 257/E21.171 |
| 2010/0167527 | A1 * | 7/2010 | Wu ......................... C23C 16/14 |
| | | | 257/E21.295 |
| 2011/0059608 | A1 * | 3/2011 | Gao ........................ C23C 16/06 |
| | | | 438/654 |
| 2014/0235054 | A1 * | 8/2014 | Lansalot-Matras ... C07F 11/005 |
| | | | 438/681 |
| 2015/0279732 | A1 | 10/2015 | Lee et al. |
| 2016/0351401 | A1 | 12/2016 | Ba et al. |
| 2020/0251340 | A1 * | 8/2020 | Shaviv ............. H01L 21/76879 |

FOREIGN PATENT DOCUMENTS

| | | | | | |
|---|---|---|---|---|---|
| JP | H0464223 | A | | 2/1992 | |
| JP | H0689873 | A | | 3/1994 | |
| JP | 2005518088 | A | | 6/2005 | |
| JP | 2006169617 | A | | 6/2006 | |
| JP | 2007173824 | A | | 7/2007 | |
| JP | 4007822 | | * | 9/2007 | ........... H01L 21/768 |
| JP | 2008-192835 | | * | 8/2008 | ........... H01L 21/286 |
| JP | 2015067869 | A | | 4/2015 | |
| KR | 20090050371 | A | | 5/2009 | |
| KR | 20100068845 | A | | 6/2010 | |
| KR | 20140014024 | A | | 2/2014 | |
| KR | 20170017789 | A | | 2/2017 | |
| KR | 20170120443 | A | | 10/2017 | |
| KR | 20190039642 | A | | 4/2019 | |
| KR | 10-2022-0015331 | | * | 2/2022 | ........... H01L 21/285 |
| TW | 202025259 | A | | 7/2020 | |
| TW | 202204663 | A | * | 2/2022 | ............. C23C 16/06 |

OTHER PUBLICATIONS

Bain, M.F., et al., "Characteristics of plasma enhanced chemical vapor deposited tungsten nitride thin films". Journal of Materials Science: Materials in Electronics 14 (2003) 329-332.*

Hosseinnejad, M.T., et al., "Deposition of tungsten nitride thin films by plasma focus device at different axial and angular positions". Applied Surface Science, vol. 257, Issue 17, Jun. 15, 2011, pp. 7653-7658.*

International Search Report for PCT/KR2021/009836, mailed Nov. 19, 2021.

Written Opinion for PCT/KR2021/009836, mailed Nov. 19, 2021.

* cited by examiner

10 : 12, 14
20 : 22, 24
30 : 32, 34, 36, 38
40 : 42, 44

METHOD FOR FORMING THIN FILM

TECHNICAL FIELD

The present disclosure relates to a thin film forming method, and more particularly, to a thin film forming method for forming a tungsten thin film.

BACKGROUND ART

Since a tungsten thin film has a low resistance and a high thermal stability, the tungsten thin film has been widely applied to an electrode or a wiring structure in a semiconductor element or an electronic device.

The tungsten thin film may be formed on a substrate or a semiconductor layer through a method such as chemical vapor deposition (CVD) and atomic layer deposition (ALD), and when a raw material in a gas state is used to form the tungsten thin film, an excellent coating rate in a stepped structure having a great aspect ratio may be obtained.

In order to form the tungsten thin film, a tungsten layer serving as a nucleation layer or a seed layer is deposited on a substrate by using a tungsten containing material, and the rest tungsten layer is deposited on the nucleation layer or the seed layer as a bulk layer. The tungsten thin film is generally produced by reducing a tungsten hexafluoride gas ($WF_6$) that is a fluorine-based tungsten material by using hydrogen ($H_2$) as a reducing agent through the CVD.

However, when the tungsten hexafluoride gas ($WF_6$) is used to form the tungsten thin film, a phenomenon in which fluorine (F) remains on the surface and the inside of tungsten thin film as impurities occurs. The remained fluorine (F) may cause fluorine (F) diffusion or electromigration to components adjacent thereto, and an overall performance of the semiconductor device may be reduced as a contact thereof is damaged.

Related Art Document (Patent document 1) KR10-2017-0120443 A

DISCLOSURE OF THE INVENTION

Technical Problem

The present disclosure provides a thin film forming method capable of forming a tungsten thin film having a reduced concentration of impurities.

Technical Solution

In accordance with an exemplary embodiment, a method for forming a thin film includes: supplying a reducing gas onto a substrate provided in a reaction space; applying a power to generate plasma in the reaction space; and supplying a tungsten containing gas onto the substrate, and the supplying of the tungsten containing gas is intermittently performed while the reducing gas is supplied.

The reducing gas and the tungsten containing gas may be supplied onto the substrate through paths that are separated from each other.

The applying of the power may be intermittently performed while the reducing gas is supplied, and the supplying of the tungsten containing gas may be performed while the power is applied to generate the plasma in the reaction space.

The applying of the power may start before the tungsten containing gas is supplied.

The method may further include supplying a silicon containing gas onto the substrate before the reducing gas is supplied.

The supplying of the silicon containing gas may be finished before the reducing gas is supplied.

The applying of the power may be finished when the supplying of the tungsten containing gas is finished.

The method may further include purging the reaction space while the power is not applied.

In accordance with another exemplary embodiment, a method for forming a thin film includes: supplying a reducing gas onto a substrate provided in a reaction space; depositing a tungsten thin film on the substrate; and removing impurities remained on the tungsten thin film, and the depositing of the tungsten thin film and the removing of the impurities are alternately performed while the reducing gas is supplied.

The depositing of the tungsten thin film may be performed by generating plasma in the reaction space and supplying the tungsten containing gas onto the substrate.

The reducing gas and the tungsten containing gas may be supplied onto the substrate through paths that are separated from each other.

The method may further include forming a silicon layer on the substrate before the supplying of the reducing gas.

The depositing of the tungsten thin film may be performed by replacing silicon atoms contained in the silicon layer with tungsten atoms.

The removing of the impurities may be performed by generating plasma in the reaction space and stopping the supplying of the tungsten containing gas onto the substrate.

The method may further include purging the reaction space between the depositing of the tungsten thin film and the removing of the impurities.

The purging of the reaction space may be performed without generating the plasma in the reaction space.

The reducing gas may include a hydrogen gas, the tungsten containing gas may include a tungsten hexafluoride gas, and the impurities may include a fluorine component.

Advantageous Effects

In accordance with the thin film forming method in accordance with an exemplary embodiment, the tungsten thin film having the reduced thin film stress and the reduced concentration of the impurities may be formed by alternately repeating the process of depositing the tungsten layer and the process of removing the impurities contained in the tungsten layer.

Also, the efficiency of the process of removing the impurities may be improved by purging the reaction space before removing the impurities contained in the tungsten layer, and thus the content of the fluorine component in the tungsten layer is reduced to the low fluorine W (LWF) level at which the content of the fluorine component is not detected through the component analysis.

DETAILED DESCRIPTION

Figure 1:
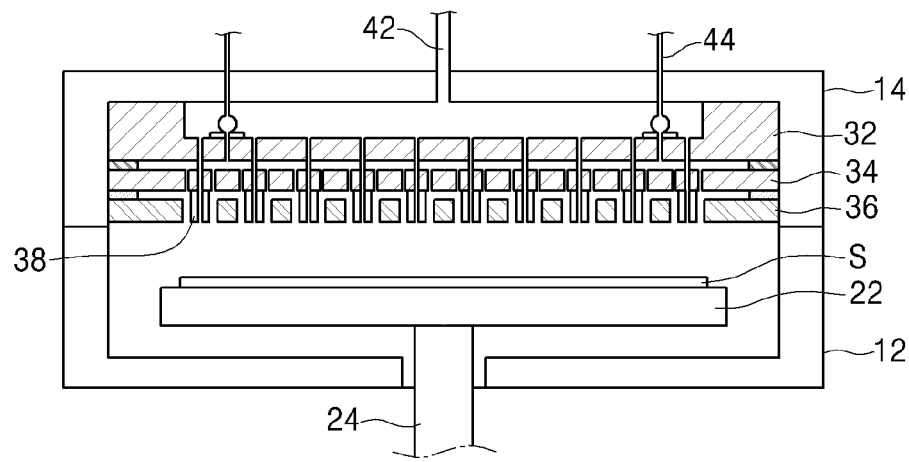
FIG. 1 is a schematic view illustrating a substrate processing apparatus in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that the present invention will be thorough and complete, and will fully convey the scope of the present invention to those skilled in the art.

It will also be understood that when a layer, a film, a region or a plate is referred to as being 'on' another one, it can be directly on the other one, or one or more intervening layers, films, regions or plates may also be present.

Also, spatially relative terms, such as "above" or "upper" and "below" or "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In the drawings, the thicknesses of layers and regions are exaggerated for clarity. In the figures, like reference numerals refer to like elements throughout.

Figure 2:
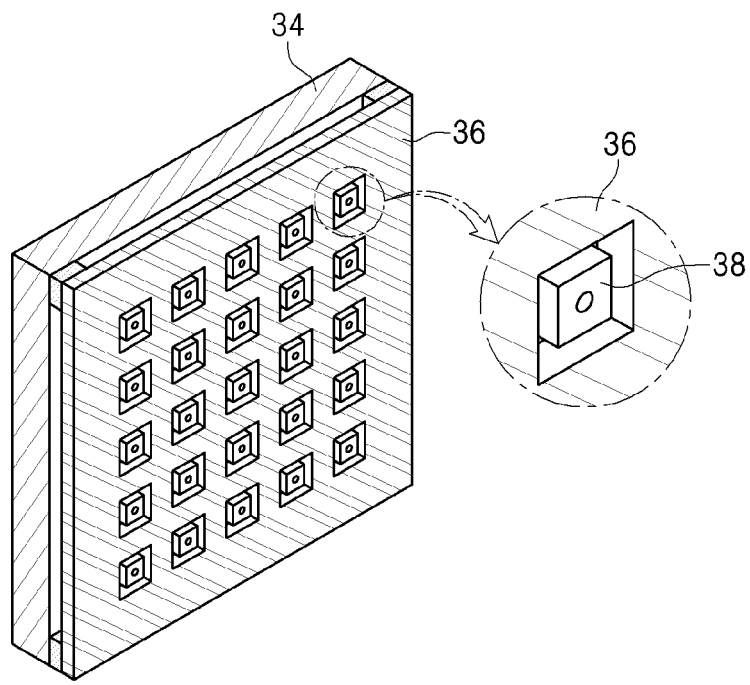
FIG. 2 is a schematic view illustrating a gas injection unit in accordance with an exemplary embodiment.
Figure 3:
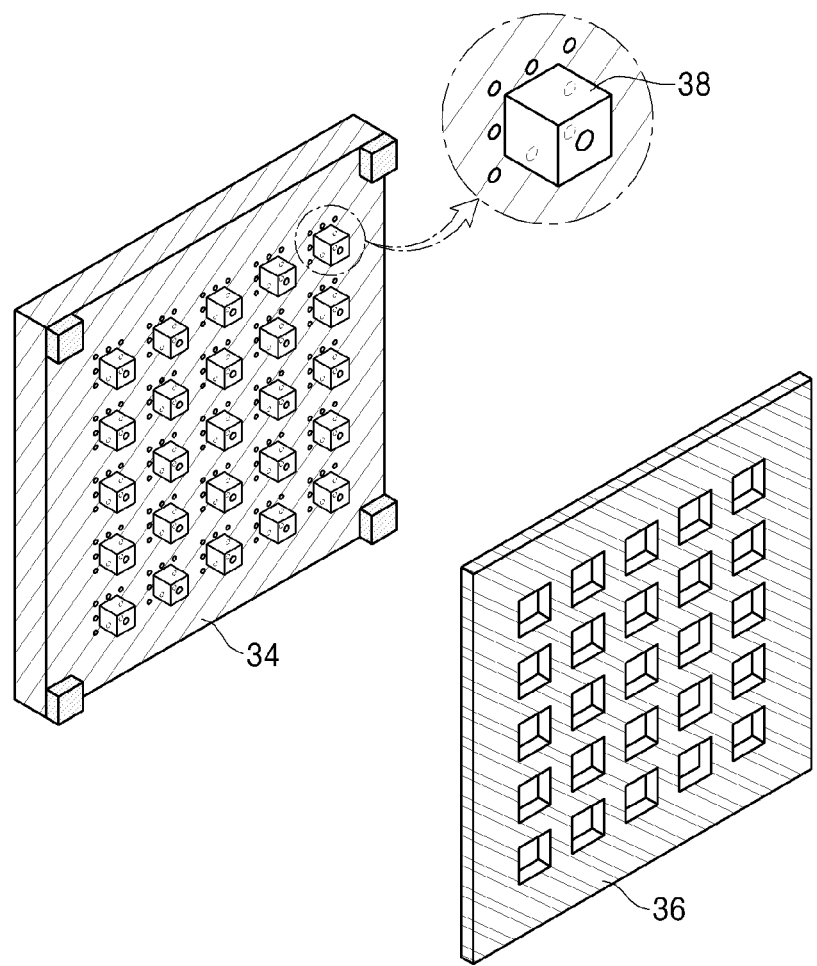
FIG. 3 is an exploded view illustrating the gas injection unit in FIG. 2.
Figure 4:
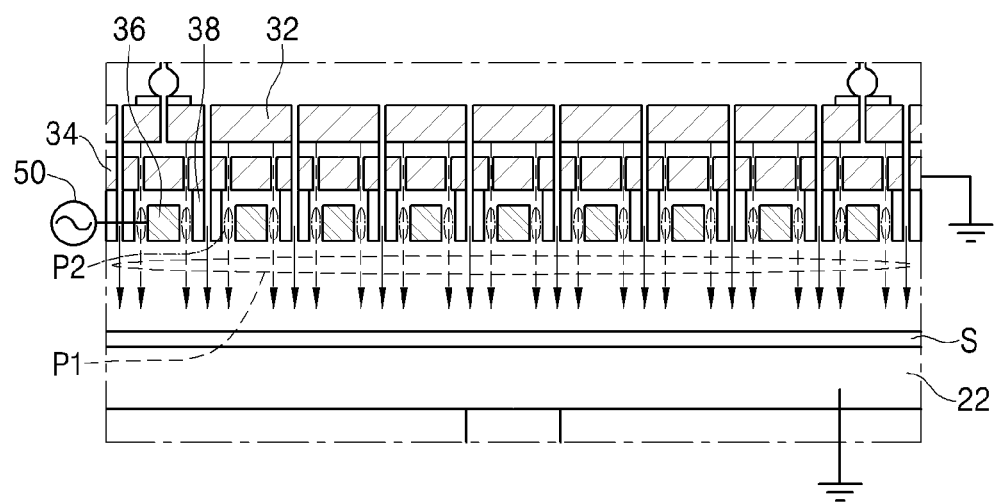
FIG. 4 is a view illustrating a state in which plasma is formed in accordance with an exemplary embodiment.

FIG. 1 is a schematic view illustrating a substrate processing apparatus in accordance with an exemplary embodiment. Also, FIG. 2 is a schematic view illustrating a gas injection unit in accordance with an exemplary embodiment, and FIG. 3 is an exploded view illustrating the gas injection unit of FIG. 2. Also, FIG. 4 is a view illustrating a state in which plasma is formed in accordance with an exemplary embodiment.

Referring to FIGS. 1 to 4, the substrate processing apparatus in accordance with an exemplary embodiment, which is an apparatus for forming a thin film, e.g., a tungsten thin film, includes: a chamber 10, a substrate support unit 20 for supporting a substrate S provided in the chamber 10, a gas injection unit 30 provided in the chamber to face the substrate support unit 20 for injecting a process gas toward the substrate support unit 20, and a gas supply unit 40 for supplying a gas to the gas injecting unit 30. Also, the substrate processing apparatus may further include a RF power supply 50 for applying a power to generate plasma in the chamber 10 and a control unit (not shown) for controlling the RF power supply 50. Here, a first gas supply path for supplying a first gas and a second gas supply path for supplying a second gas are separately formed in the gas injection unit 30.

The chamber 10 provides a predetermined reaction space and maintains sealing thereof. The chamber 10 may include a body 12 including a flat part having an approximately circular or rectangular shape and a sidewall part extending upward from the flat part to have the predetermined reaction space and a cover 14 having an approximately circular or rectangular shape and disposed on the body 12 to maintain sealing of the reaction space. However, the exemplary embodiment is not limited to the chamber 10. For example, the chamber 10 may have various shapes in correspondence to a shape of the substrate S.

An exhaust hole (not shown) may be defined in a predetermined area of a bottom surface of the chamber 10, and an exhaust pipe (not shown) connected to the exhaust hole may be provided at the outside of the chamber 10. Also, the exhaust pipe may be connected to an exhaust device (not shown). A vacuum pump such as a turbo molecular pump may be used as the exhaust device. Thus, the inside of the chamber 10 may be vacuum-suctioned until a predetermined reduced pressure atmosphere, e.g., a predetermined pressure equal to or less than 0.1 mTorr, by the exhaust device. The exhaust pipe may be installed on a side surface of the chamber below the substrate support unit 20 that will e described later in addition to the bottom surface of the chamber 10. Also, a plurality of exhaust pipes and the exhaust devices for the exhaust pipes may be further installed to reduce an exhaust time.

Also, the substrate S, which is loaded into the chamber 10 for a thin film forming process, may be seated on the substrate support unit 20. Here, the substrate S may be a substrate serving as a seed layer or a nucleation layer for depositing a tungsten layer thereon to form a tungsten thin film or a substrate on which the nucleation layer or the seed layer is already formed to form a tungsten layer as a bulk layer on the nucleation layer or the seed layer. The substrate support unit 20 may include, e.g., an electrostatic chuck to absorb and maintain the substrate S by an electrostatic force so that the substrate S is seated and supported or support the substrate S by vacuum absorption or a mechanical force.

The substrate support unit 20 may have a shape corresponding to a shape of the substrate S, e.g., a circular or rectangular shape. The substrate support unit 20 may include a substrate support 22 on which the substrate S is seated and an elevator 24 disposed below the substrate support 22 to elevate the substrate support 22. Here, the substrate support 22 may be greater in size than the substrate S, the elevator 24 may be provided to support at least one area, e.g., a central portion, of the substrate support 22, and move the substrate support 22 to be adjacent to the gas injection unit 30 when the substrate S is seated. Also, a heater (not shown) may be installed in the substrate support 22. The heater may generate heat at a predetermined temperature to heat the substrate support 22 and the substrate S seated on the substrate support 22, so that a thin film is uniformly deposited on the substrate S.

The gas supply unit 40 may be installed to pass through the cover 14 of the chamber 10 and include a first gas supplier 42 and a second gas supplier 44 for respectively supplying a first gas and a second gas to the gas injection unit 30. Here, the first gas may include a tungsten containing gas, and the second gas may include a reducing gas. On the contrary, the first gas may include a reducing gas, and the second gas may include a tungsten containing gas. Also, the tungsten containing gas may include a tungsten hexafluoride ($WF_6$) gas, and the reducing gas may include a hydrogen ($H_2$) gas. Here, each of the first gas supplier 42 and the second gas supplier 44 may not necessarily supply only one gas. For example, each of the first gas supplier 42 and the second gas supplier 44 may be configured to simultaneously supply a plurality of gases or supply a gas selected from a plurality of gases.

The gas injection unit 30 is installed in the chamber 10, e.g., installed on a bottom surface of the cover 14, and the first gas supply path for injecting and supplying the first gas onto the substrate and the second gas supply path for injecting and supplying the second gas onto the substrate are formed in the gas injecting unit 30. The first gas supply path and the second gas supply path may be independently separated from each other and separately supply the first gas and the second gas onto the substrate so that the first gas and the second gas are not mixed in the gas injection unit 30.

The gas injection unit 30 may include an upper frame 32 and a lower frame 34. Here, the upper frame 32 is detachably coupled to the bottom surface of the cover 14, and at the same time, a portion of a top surface, e.g., a central portion of the top surface, of the upper frame 32 is spaced a predetermined distance from the bottom surface of the cover 14. Thus, the first gas supplied from the first gas supplier 42 may be diffused in a space between the top surface of the upper frame 32 and the bottom surface of the cover 14. Also, the lower frame 34 is spaced a predetermined distance from a bottom surface of the upper frame 32. Thus, the second gas supplied from the second gas supplier 44 may be diffused in a space between the bottom surface of the upper frame 32 and a top surface of the lower frame 34. The upper frame 32 and the lower frame 34 may be connected along outer circumferential surfaces thereof and form a spaced space therein, thereby being integrated with each other. Alternatively, the outer circumferential surfaces of the upper frame 32 and the lower frame 34 may be sealed by a separate sealing member.

The first gas supply path may be formed so that the first gas supplied from the first gas supplier 42 is diffused in the space between the bottom surface of the cover 14 and the upper frame 32 and supplied into the chamber 10 by passing through the upper frame 32 and the lower frame 34. Also, the second gas supply path may be formed so that the second gas supplied from the second gas supplier 44 is diffused in the space between the bottom surface of the upper frame 32 and the top surface of the lower frame 34 and supplied into the chamber 10 by passing through the lower frame 34. The first gas supply path and the second gas supply path may not communicate with each other, and thus the first gas and the second gas may be separately supplied into the chamber from the gas supply unit 40 through the gas injection unit 30.

A first electrode 38 may be installed on the bottom surface of the lower frame 34, and a second electrode 36 may be spaced a predetermined distance from a lower side of the lower frame 34 and an outer side of the first electrode 38. Here, the lower frame 34 and the second electrode 36 may be connected along outer circumferential surfaces thereof. Alternately, the outer circumferential surfaces of the lower frame 34 and the second electrode 36 may be sealed by a separate sealing member.

As described above, when the first electrode 38 and the second electrode 36 are installed, the first gas may be injected onto the substrate through the first electrode 38, and the second gas may be injected onto the substrate through a spaced space between the first electrode 38 and the second electrode 36.

A RF power may be applied from the RF power supply 50 to one of the lower frame 34 and the second electrode 36. In FIG. 4, a structure in which the lower frame 34 is grounded, and the RF power is applied to the second electrode 36 is illustrated as an example. When the lower frame 34 is grounded, the first electrode 38 installed on the bottom surface of the lower frame 34 is also grounded. Thus, when the RF power is applied from the RF power supply 50 to the second electrode 36, a first activation region, i.e., a first plasma region P1, may be formed between the gas injection unit 30 and the substrate support unit 20, and a second activation region, i.e., a second plasma region P2, may be formed between the first electrode 38 and the second electrode 36.

FIG. 4 is a view illustrating a state in which plasma is formed in accordance with an exemplary embodiment. Although the first electrode 38 and the substrate support unit 20 are grounded, and the RF power is applied from the RF power supply 50 to the second electrode 36 as an example in FIG. 4, a structure of applying the power from the power supply is not limited thereto.

As illustrated in FIG. 4, the first gas, e.g., the tungsten containing gas, may be supplied into the chamber 10 along an arrow illustrated by a solid line, and the second gas, e.g., the reducing gas, may be supplied into the chamber 10 along an arrow illustrated by a dotted line. The first gas may pass the inside of the first electrode 38 and be supplied into the chamber 10, and the second gas may pass through the spaced space between the first electrode 38 and the second electrode 36 and be supplied into the chamber 10. The first gas may pass through the first electrode 38 and be supplied into the chamber 10.

When the first electrode 38 and the substrate support unit 20 are grounded, and the power is applied to the second electrode 36, the first activation region, i.e., the first plasma region P1, may be formed between the gas injection unit and the substrate support unit 20, and the second activation region, i.e., the second plasma region P2, may be formed between the first electrode 38 and the second electrode 36.

Thus, when the first gas is supplied through the first electrode 38, the first gas is activated in the first plasma region P1 formed outside the gas injection unit 30. Also, when the second gas is supplied through the spaced space between the first electrode 38 and the second electrode 36, the second gas may be activated in a region between the first electrode 38 and the second electrode 36, which corresponds to the inside of the gas injection unit 30, i.e., a region from the second plasma region P2 to the first plasma region P1. Thus, the substrate processing apparatus in accordance with an exemplary embodiment may respectively activate the first gas and the second gas in plasma regions having different sizes. Also, as the first gas and the second gas are activated in the plasma regions having different sizes, each of the gases may be distributed through an optimized supply path for depositing a thin film.

Hereinafter, a thin film forming method in accordance with an exemplary embodiment will be described in detail with reference to FIGS. 5 to 7. When the thin film forming method in accordance with an exemplary embodiment is described, a description overlapping that of the above-described substrate processing apparatus will be omitted.

Figure 5:
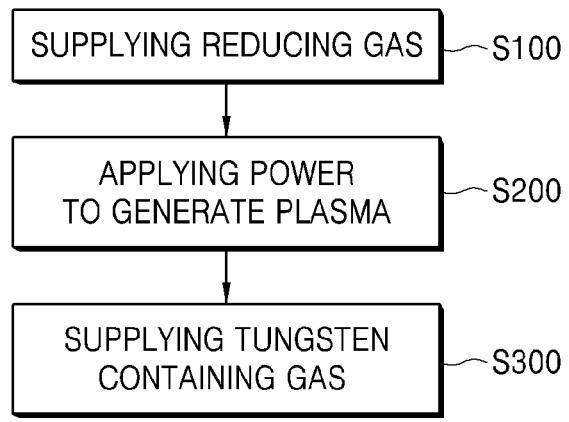
FIG. 5 is a schematic flowchart representing a thin film forming method in accordance with an exemplary embodiment.
Figure 6:
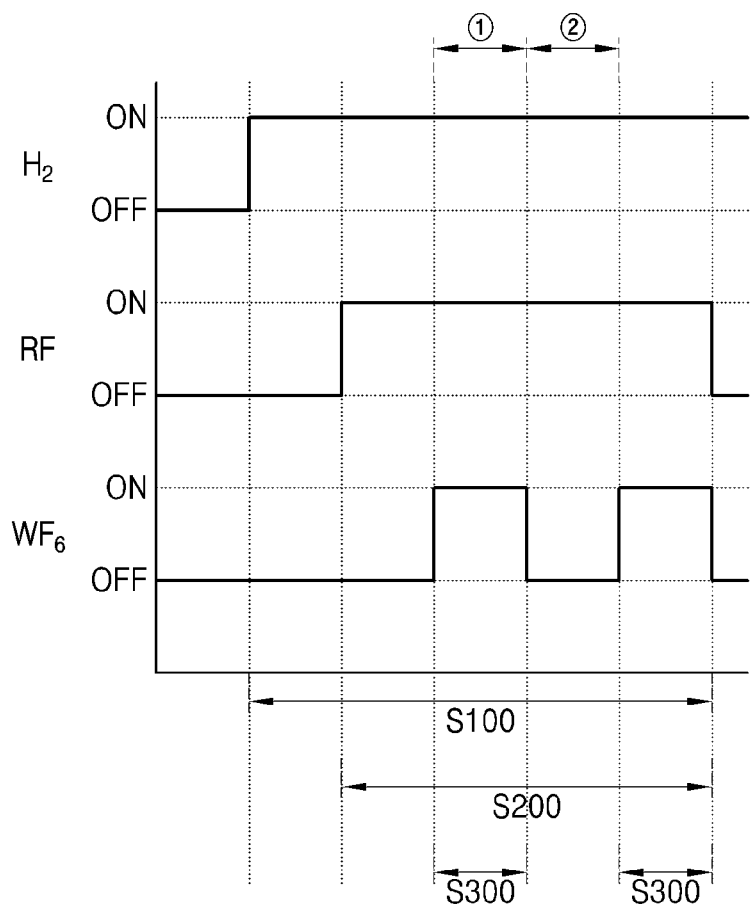
FIG. 6 is a view for explaining a process cycle of the thin film forming method in accordance with an exemplary embodiment.
Figure 7:
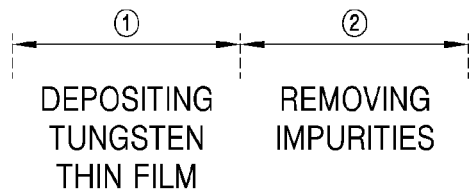
FIG. 7 is a view for explaining each of processes for forming a thin film in the process cycle.

FIG. 5 is a schematic flowchart representing the thin film forming method in accordance with an exemplary embodiment, FIG. 6 is a view for explaining a process cycle of the thin film forming method in accordance with an exemplary embodiment, and FIG. 7 is a view for explaining each of processes of forming the thin film in the process cycle.

Referring to FIGS. 5 to 7, the thin film forming method in accordance with an exemplary embodiment includes: a process S100 of supplying a reducing gas onto a substrate S provided in a reaction space; a process S200 of applying a power to generate plasma in the reaction space; and a process S300 of supplying a tungsten containing gas onto the substrate S, and the process S300 of supplying a tungsten containing gas onto the substrate S is intermittently performed while the reducing gas is supplied.

The process S100 of supplying the reducing gas supplies the reducing gas onto the substrate S provided in the reaction space of a chamber 10. The process S100 of supplying the reducing gas may continuously maintain the supplying of the reducing gas until a tungsten thin film is formed in the thin film forming method in accordance with an exemplary embodiment. Here, the reducing gas may include a gas containing hydrogen (H), e.g., a hydrogen ($H_2$) gas.

The process S100 of supplying the reducing gas may supply the reducing gas onto the substrate S before the tungsten containing gas is supplied and continuously maintain the supplying of the reducing gas until the tungsten thin film is formed. Here, the reaction space in the chamber 10 may be formed as a reducing atmosphere by the reducing gas, e.g., the hydrogen ($H_2$) gas, supplied before the tungsten containing gas, e.g., the tungsten hexafluoride gas ($WF_6$), is supplied. As described above, when the reducing atmosphere is formed in the reaction space in the chamber 10 by the hydrogen ($H_2$) gas before the tungsten hexafluoride gas ($WF_6$) is supplied, a fluorine (F) component of the tungsten hexafluoride gas ($WF_6$) may be primarily removed as the tungsten hexafluoride gas ($WF_6$) reacts with a hydrogen (H) radical activated by the hydrogen ($H_2$) gas or the plasma in a space between the gas injection unit 30 and the substrate S.

Also, as described above, the substrate S may be a substrate serving as a seed layer or a nucleation layer for forming a tungsten thin film or a substrate on which the nucleation layer or the seed layer is already formed to form a tungsten layer as a bulk layer on the nucleation layer or the seed layer.

The process S200 of applying the power applies a high frequency power from a RF power supply 50 to generate plasma in the reaction space. When the hydrogen ($H_2$) gas is supplied as the reducing gas in the process S100 of supplying the reducing gas, the hydrogen ($H_2$) gas may be activated as the hydrogen (H) radical by the plasma generated in the reaction space in the process S200 of applying the power.

The process S300 of supplying the tungsten containing gas supplies the tungsten containing gas onto the substrate S. Here, the tungsten containing gas may include a gas containing tungsten (W), e.g., the tungsten hexafluoride gas ($WF_6$).

Here, when the high frequency power is applied from the RF power supply 50 in the process of applying the power, and the tungsten containing gas is supplied onto the substrate S in the process S300 of supplying the tungsten containing gas, a limitation of depositing the tungsten (W) in the gas injection unit 30 generally occurs. That is, when the high frequency power is applied to the general shower head type gas injection unit 30, and the first gas, i.e., the tungsten containing gas, and the second gas, i.e., the reduction gas, are supplied through the gas injection unit 30, as the tungsten containing gas and the reducing gas react with each other in the gas injection unit 30, the tungsten (W) may be deposited in the gas injection unit 30.

However, as described above, the first gas supply path and the second gas supply path are independently and separately formed in the gas injection unit 30 instead of communicating with each other in accordance with an exemplary embodiment. Thus, as the tungsten containing gas supplied through the first electrode 38 in FIG. 4 reacts with the reducing gas below the gas injection unit 30 instead of reacting with the reducing gas supplied between the first electrode and the second electrode 36 in the gas injection unit 30, deposition of the tungsten (W) in the gas injection unit 30 may be effectively prevented.

As described above, when the process S300 of supplying the tungsten containing gas is performed while continuously maintaining the process S100 of supplying the reducing gas, the tungsten hexafluoride gas ($WF_6$) is reduced by reacting with the hydrogen ($H_2$) gas as in a chemical reaction equation 1 below, and a tungsten layer is formed on the substrate S.

$$WF_6(g)+3H_2(g) \rightarrow W(s)+6HF \text{ (g) } \uparrow \text{ [Chemical reaction equation 1]}$$

Here, the process S300 of supplying the tungsten containing gas may be intermittently performed while the reducing gas is supplied. That is, the process S100 of supplying the reducing gas is continuously maintained until the tungsten thin film is formed, and the process S300 of supplying the tungsten containing gas may be intermittently performed so that supplying and stop-supplying of the tungsten containing gas are alternately performed while the reducing gas is supplied.

Here, in a section of simultaneously supplying the hydrogen containing gas, i.e., the hydrogen ($H_2$) gas, and the tungsten containing gas, i.e., the tungsten hexafluoride gas ($WF_6$) onto the substrate S, the tungsten hexafluoride gas ($WF_6$) and the hydrogen ($H_2$) gas react with each other, and the tungsten thin film is deposited on the substrate S. That is, a process of depositing the tungsten layer on the substrate S may be performed as the tungsten hexafluoride gas ($WF_6$) and the hydrogen ($H_2$) gas react with each other in the section of simultaneously supplying the hydrogen ($H_2$) gas and the tungsten hexafluoride gas ($WF_6$).

While only the hydrogen ($H_2$) gas is supplied onto the substrate S because the supplying of the tungsten containing gas is stopped, impurities, e.g., the fluorine (F) component, of the tungsten layer formed on the substrate S may be removed by the supplied hydrogen ($H_2$) gas.

Even when the tungsten hexafluoride gas ($WF_6$) and the hydrogen ($H_2$) gas are simultaneously supplied and react with each other, the fluorine (F) component contained in the tungsten hexafluoride gas ($WF_6$) is not completely removed. Thus, in the thin film forming method in accordance with an exemplary embodiment, as the supplying and stop-supplying of the tungsten hexafluoride gas ($WF_6$) are repeated while the hydrogen ($H_2$) gas is supplied, the tungsten layer is deposited in the section of simultaneously supplying the hydrogen ($H_2$) gas and the tungsten hexafluoride gas ($WF_6$), and the deposited tungsten layer is treated by the hydrogen ($H_2$) gas to remove the impurities, i.e., the fluorine (F) component, contained in the deposited tungsten layer in a section of supplying only the hydrogen ($H_2$) gas. As described above, in an exemplary embodiment, a content of the fluorine (F) component in the tungsten layer may be reduced to a low fluorine W (LWF) level at which a content of the fluorine (F) component in the tungsten layer is not detected through a component analysis by alternately performing the process of depositing the tungsten layer and the process of removing the impurities of the deposited tungsten layer.

The thin film forming method in accordance with an exemplary embodiment may further include a process of supplying a silicon containing gas onto the substrate S before the reducing gas is supplied. That is, a silicon layer may be formed on the substrate S before the reducing gas is supplied, and then the tungsten thin film may be deposited on the substrate S by replacing silicon atoms contained in the silicone layer with tungsten atoms in the process S300 of supplying the tungsten gas. Here, the silicon containing gas may include a silane (SiH4) gas, and the silicon atoms contained in the silicon layer may act with the tungsten containing gas as in a chemical reaction equation 2 and be replaced by the tungsten atoms.

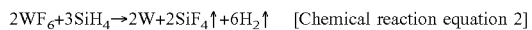

$$2WF_6 + 3SiH_4 \rightarrow 2W + 2SiF_4\uparrow + 6H_2\uparrow \quad \text{[Chemical reaction equation 2]}$$

Here, the process of supplying the silicon containing gas may be finished before the process S100 of supplying the reducing gas is performed. Also, the process of supplying the silicon containing gas may be performed one time before a process cycle including the process S100 of supplying the reducing gas onto the substrate S provided in the reaction space, the process S200 of applying the power to generate plasma in the reaction space, and the process S300 of supplying the tungsten containing gas onto the substrate S or repeatedly performed before the process S100 of supplying the reducing gas included in the process cycle, which will be describe later.

Here, the process S200 of applying the power may be continuously performed while the hydrogen ($H_2$) gas is supplied to activate the hydrogen ($H_2$) gas as the hydrogen (H) radical by the plasma thereby reacting with the tungsten hexafluoride gas ($WF_6$) in the section of simultaneously supplying the hydrogen ($H_2$) gas and the tungsten hexafluoride gas ($WF_6$), and activate the hydrogen ($H_2$) gas as the hydrogen (H) radical by the plasma thereby treating the tungsten layer deposited on the substrate S by using the hydrogen ($H_2$) gas in the section of supplying only the hydrogen ($H_2$) gas.

However, the process S200 of applying the power may be intermittently performed while the reducing gas is supplied, and the process of supplying the tungsten containing gas may be performed while the power is applied to generate the plasma in the reaction space. Here, an exemplary embodiment may further include a process of purging the reaction space while the power is applied.

When the tungsten hexafluoride gas ($WF_6$) is intermittently supplied, the tungsten hexafluoride gas ($WF_6$) is remained in the reaction space even directly after the supplying of the tungsten hexafluoride gas ($WF_6$) is stopped. In case that the tungsten hexafluoride gas ($WF_6$) is remained in the reaction space, when the supplying of the tungsten hexafluoride gas ($WF_6$) is stopped, and the hydrogen ($H_2$) gas is supplied, the supplied hydrogen ($H_2$) gas may react with the remained tungsten hexafluoride gas ($WF_6$), and thus the tungsten layer deposited on the substrate S may not be sufficiently treated.

Thus, in an exemplary embodiment, the process S200 of applying the power may be intermittently performed while the reducing gas is supplied and purge the reaction space while the power is not applied to remove the tungsten hexafluoride gas ($H_2$) remained in the reaction space in the chamber 10.

After the supplying of the power is stopped, and the reaction space is purges, the process S200 of applying the power may start before the tungsten containing gas is supplied again. Here, only the hydrogen ($H_2$) gas is supplied before the power is applied, and the tungsten containing gas is supplied again, and the supplied hydrogen ($H_2$) gas is activated by the plasma to treat the tungsten layer deposited on the substrate S, thereby removing the fluorine (F) component contained in the tungsten layer. Also, the process S200 of applying the power may be finished simultaneously when the supplying of the tungsten containing gas is stopped to secure an enough time for purging the reaction space.

Also, the process S100 of supplying the reduction gas may supply the reducing gas onto the substrate S before the tungsten containing gas is supplied and continuously maintain the supplying of the reducing gas until the tungsten thin film is formed. Here, the reaction space in the chamber 10 may be formed as the reducing atmosphere by the reducing gas supplied before the tungsten containing gas is supplied. Thereafter, as the tungsten hexafluoride gas ($WF_6$) that is the tungsten containing gas is supplied, the hydrogen (H) component of the reducing gas, which is continuously supplied to the reaction space, and the fluorine (F) component of the tungsten hexafluoride gas ($WF_6$) are coupled, a hydrogen fluoride (HF) gas may be generated and removed, and the tungsten layer from which the fluorine (F) component is primarily removed may be formed on the substrate S.

As illustrated in FIGS. 6 and 7, in an exemplary embodiment, a section (a section ①) of depositing the tungsten layer by applying the power and supplying the tungsten hexafluoride gas ($WF_6$) while the hydrogen ($H_2$) gas is supplied and a section (a section ②) of removing the impurities by applying the power without the supplying of the tungsten hexafluoride gas ($WF_6$) while the hydrogen ($H_2$) gas is supplied form one process cycle. Alternatively, one process cycle may further include a section of purging the reaction space between the section (the section ①) of depositing the tungsten layer and the section (the section ②) of removing the impurities. The process cycle may be repeated a plurality of times, and through this, the section of depositing the tungsten layer, the section of purging the reaction space, and the section of removing the impurities may be repeatedly included to effectively remove the fluorine (F) component contained in the tungsten layer, thereby forming the tungsten thin film having a remarkably reduced concentration of the impurities.

In the thin film forming method in accordance with an exemplary embodiment, the tungsten thin film having the reduced thin film stress and the reduced concentration of the impurities may be formed by alternately repeating the process of depositing the tungsten layer and the process of removing the impurities contained in the tungsten layer.

Also, the efficiency of the process of removing the impurities may be improved by purging the reaction space before removing the impurities contained in the tungsten layer, and thus the content of the fluorine component in the tungsten layer is reduced to the low fluorine W (LWF) level at which the content of the fluorine component is not detected through the component analysis.

Although the exemplary embodiments of the present invention have been described, it is understood that the present invention should not be limited to these embodiments but various changes and modifications can be made by one ordinary skilled in the art within the spirit and scope of the present invention as hereinafter claimed. Therefore, it should be understood that simple modifications according to the embodiments of the present invention may belong to the technical spirit of the present invention.

What is claimed is:

1. A method for forming a thin film, comprising:
   supplying a reducing gas onto a substrate provided in a reaction space;
   applying a power to generate plasma in the reaction space; and
   supplying a tungsten containing gas onto the substrate,
   wherein the supplying of the tungsten containing gas is intermittently performed while the reducing gas is supplied, and
   wherein the supplying of the reducing gas is performed before the tungsten containing gas is supplied and is continuously maintained until a tungsten thin film is formed.

2. The method of claim 1, wherein the reducing gas and the tungsten containing gas are supplied onto the substrate through paths that are separated from each other.

3. The method of claim 1, wherein the applying of the power is intermittently performed while the reducing gas is supplied, and the supplying of the tungsten containing gas is performed while the power is applied to generate the plasma in the reaction space.

4. The method of claim 3, wherein the applying of the power starts before the tungsten containing gas is supplied.

5. The method of claim 1, further comprising supplying a silicon containing gas onto the substrate before the reducing gas is supplied.

6. The method of claim 5, wherein the supplying of the silicon containing gas is finished before the reducing gas is supplied.

7. The method of claim 3, wherein the applying of the power is finished when the supplying of the tungsten containing gas is finished.

8. The method of claim 3, further comprising purging the reaction space while the power is not applied.

9. A method for forming a thin film, comprising:

supplying a reducing gas onto a substrate provided in a reaction space;

depositing a tungsten thin film on the substrate by supplying a tungsten containing gas; and removing impurities remained on the tungsten thin film, wherein the depositing of the tungsten thin film and the removing of the impurities are alternately performed while the reducing gas is supplied, and wherein the supplying of the reducing gas is performed before the tungsten containing gas is supplied and is continuously maintained until a tungsten thin film is formed.

10. The method of claim 9, wherein the depositing of the tungsten thin film is performed by generating plasma in the reaction space and supplying a tungsten containing gas onto the substrate.

11. The method of claim 10, wherein the reducing gas and the tungsten containing gas are supplied onto the substrate through paths that are separated from each other.

12. The method of claim 9, further comprising forming a silicon layer on the substrate before the supplying of the reducing gas.

13. The method of claim 12, wherein the depositing of the tungsten thin film is performed by replacing silicon atoms contained in the silicon layer with tungsten atoms.

14. The method of claim 10, wherein the removing of the impurities is performed by generating plasma in the reaction space and stopping the supplying of the tungsten containing gas onto the substrate.

15. The method of claim 10, further comprising purging the reaction space between the depositing of the tungsten thin film and the removing of the impurities.

16. The method of claim 15, wherein the purging of the reaction space is performed without generating the plasma in the reaction space.

17. The method of claim 10, wherein the reducing gas comprises a hydrogen gas, the tungsten containing gas comprises a tungsten hexafluoride gas, and the impurities comprise a fluorine component.

* * * * *